(12) United States Patent
Mohammed

(10) Patent No.: US 7,208,820 B2
(45) Date of Patent: Apr. 24, 2007

(54) SUBSTRATE HAVING A PLURALITY OF I/O ROUTING ARRANGEMENTS FOR A MICROELECTRONIC DEVICE

(75) Inventor: Ilyas Mohammed, Santa Clara, CA (US)

(73) Assignee: Tessera, Inc., San Jose, CA (US)

(*) Notice: Subject to any disclaimer, the term of this patent is extended or adjusted under 35 U.S.C. 154(b) by 59 days.

(21) Appl. No.: 11/025,440

(22) Filed: Dec. 29, 2004

(65) Prior Publication Data

US 2006/0141665 A1   Jun. 29, 2006

(51) Int. Cl.
*H01L 23/495* (2006.01)

(52) U.S. Cl. .................. 257/666; 257/778; 257/E23; 257/141

(58) Field of Classification Search .............. 257/666, 257/672, 673, 678, 713, 777, 778, 781
See application file for complete search history.

(56) References Cited

U.S. PATENT DOCUMENTS

| 5,777,379 A | * | 7/1998 | Karavakis et al. .......... 257/668 |
| 5,861,666 A | | 1/1999 | Bellaar |
| 5,929,517 A | * | 7/1999 | Distefano et al. ........... 257/707 |
| 6,043,563 A | * | 3/2000 | Eldridge et al. ............ 257/784 |
| 6,121,676 A | | 9/2000 | Solberg |
| 6,225,688 B1 | | 5/2001 | Kim |
| 6,465,893 B1 | | 10/2002 | Khandros |
| 6,699,730 B2 | | 3/2004 | Kim |
| 6,847,107 B2 | * | 1/2005 | Fjelstad et al. ............. 257/690 |

* cited by examiner

*Primary Examiner*—David Nhu
(74) *Attorney, Agent, or Firm*—Lerner, David, Littenberg, Krumholz & Mentlik, LLP

(57) ABSTRACT

A substrate is provided for packaging a microelectronic device having a pattern of contacts on the surface thereof. The substrate is formed from a support member having a substantially planar surface, and first, second, and third electrically conductive paths. The electrically conductive paths each extends from a corresponding device-attachable region on the substantially planar surface. The third device-attachable regions are each substantially equidistant to the first and second device-attachable regions. In addition, the device contact pattern may correspond spatially to a pattern formed by the first and third device-attachable regions or by the second and third device-attachable regions may form a second pattern. Also provided is a method for attaching a microelectronic device to a substrate. The invention is particularly suited for use in forming packages having a flip-chip configuration.

33 Claims, 4 Drawing Sheets

SUBSTRATE HAVING A PLURALITY OF I/O ROUTING ARRANGEMENTS FOR A MICROELECTRONIC DEVICE

BACKGROUND OF THE INVENTION

The invention relates generally to substrates for packaging microelectronic devices. In particular, the invention relates to substrates for packaging microelectronic devices that facilitate different I/O routing arrangements. Also provided are methods for packaging microelectronic devices, optionally in a flip-chip configuration.

Microelectronic device packages have been trending toward reduced package size and increased numbers of inputs and outputs (I/O). For example, chip-scale packages (CSP) are now widely used for many electronic applications including portable and telecommunication products. CSPs typically include a microelectronic semiconductor device bonded, e.g., via wires or leads, to a substrate having contacts thereon. The substrate is typically only slightly larger than the device bonded thereto and has an increasingly finer contact pitch. The substrate contacts may have a pitch of 0.8 mm or less. In some instances, packages CSPs have as low as 0.4 mm pitch.

To reduce package size further, a flip-chip configuration may be employed. In this configuration, the front or contact-bearing surface of the microelectronic device faces towards a connection structure. Each contact on the device is joined by a solder bond to a corresponding contact pad on the connection structure, by positioning solder balls on the connection structure or device, juxtaposing the device with the connection structure in the front-face-down orientation, and momentarily reflowing the solder. Unlike the typical CSP configuration, wire or lead bonds are not required. As a result, the assembly occupies an area of the connection structure no larger than the area of the chip itself. In some instances, the substrate associated with a flip-chip package may have a smaller area than the device bonded thereto.

The flip-chip packaging configuration exhibits a number of advantages over other packaging configurations. For example, flip-chip configurations offer exceptional electrical performance, because eliminating bond wires may shorten the length of electrical paths by a factor of 25 to 100. In addition, the delaying inductance and capacitance of the connection may be reduced by a factor of 10. As a result, the flip-chip configuration provides a high-speed off-chip interconnection.

In addition, the flip-chip configuration is considered one of the most rugged mechanical interconnection configurations. Flip chips, when completed with an adhesive underfill, form durable solid blocks. They have been shown to withstand laboratory simulations of rocket liftoff and of artillery firing.

Furthermore, the flip-chip configuration can be the lowest cost interconnection for high volume automated production, with costs below $0.01 per connection. As a result, the flip-chip configuration is ubiquitous in the automotive industry as well as in low cost consumer watches. Furthermore, the flip-chip configuration is gaining popularity in smart cards, radio frequency identification (RF-ID) devices, cellular telephones, and other cost-dominated applications.

Notably, the flip-chip configuration provides a high degree of I/O connection flexibility. When wire bond connections are used, they may be limited to the perimeter of the die, driving die sizes up as the number of connections increases. In contrast, flip-chip connections can use the whole area of the die, accommodating many more connections on a smaller die. Area connections also allow 3-D stacking of microelectronic devices and other components. For example, devices having substantially similar functionality, e.g., memory chips, may be packaged together to provide greater capacity, increased speed, and/or improved performance. Patents describing stacked packaging of microelectronic devices include, for example, U.S. Pat. Nos. 5,861,666, 6,121,676, 6,225,688, 6,465,893, and 6,699,730.

A wide range of flip-chip materials, equipment, and service providers is available. For example, rigid laminate substrates have been used to package microelectronic devices. Such substrates may include two to four alternating layers fiberglass and epoxy, wherein successive fiberglass layers may be laid in traversing, e.g., orthogonal, directions. bismaleimide triazine (BT) may also be incorporated in such substrates to provide greater thermal stability. In addition, metal-clad tapes of copper-on-polyimide are commonly used for fine-line and high-density electronic interconnection applications.

The flip-chip packaging configuration requires a substrate having conductive regions on a surface thereof that corresponds to the contact pattern of the device to be bonded thereto. Thus, current practice requires a uniquely designed substrate for any particular microelectronic device. In addition, in stacked packages of identical or similar microelectronic devices, unique I/O routing may be achieved through different techniques such as wire-bond, trace break, trace join, and etc. Of course, each substrate can be uniquely designed, but uniquely designed substrates increases package cost.

Accordingly, there exist opportunities in the art to provide alternatives and improvements to substrate technologies for compact microelectronic device packaging applications, particularly those technologies compatible with rigid bonding techniques associated with the flip-chip configuration and those technologies that require versatile I/O routing arrangements.

SUMMARY OF THE INVENTION

In a first aspect, the invention provides a substrate for packaging a microelectronic device. The substrate is formed from a support member having a substantially planar surface, and first, second, and third electrically conductive paths. Each electrically conductive paths extends from a corresponding device-attachable region on the substantially planar surface. In addition, the third device-attachable regions are each substantially equidistant to the first and second device-attachable regions. Typically, each first, second, and third electrically conductive path is located entirely on the substantially planar surface.

In addition, equal numbers of first and second electrically conductive paths may be provided. Thus, each first device-attachable region may have a corresponding second device-attachable region. For high pitch applications, the corresponding first and second device-attachable regions may be no more than about 1 mm, preferably no more than about 0.1 mm, from each other.

The electrically conductive paths and the device-attachable regions may be positioned in a variety of arrangements. For example, the first and third device-attachable regions may be colinear. In addition, at least portions of the first and second electrically conductive paths may be colinear. Furthermore, at least portions of the first and third and/or first and second electrically conductive paths may be parallel.

Each electrically conductive path also includes a corresponding terminal. Typically, the first terminal and at least some third terminals are arranged in a first array. In addition, the second terminal and at least some third terminals may be arranged in a second array. In such a case, the first and second arrays may exhibit mirror symmetry.

In any case, the substrate may be made from different materials. Typically, the support member is flexible. As a result, a plurality of substrates may be provided as a continuous roll to form a reel. In addition, at least some of the electrically conductive paths, at least some of the device-attachable regions, and/or at least some terminals may comprise a metal. Exemplary metals include gold, copper, silver, nickel, tin, chromium, iron, alloys thereof, or combinations of any of the foregoing. Furthermore, a solder mask may be provided on a portion of the substantially planar surface. Optionally, no conductive via extends through the support member.

In another aspect, the invention also provides a microelectronic assembly, comprising a microelectronic device and a substrate. The microelectronic device has a front surface and a plurality of electrical contacts arranged in a device contact pattern thereon. Typically, the device contact pattern comprises an array of electrical contacts. In addition, the electrical contacts of the array may be colinear.

In some instances, the substrate as described above may serve as a component of the assembly. However, other substrates may be used as well. For example, the substrate may include a support member having a substantially planar surface, and first, second, and third electrically device-attachable regions on the substantially planar surface, wherein each region extends along a conductive path to corresponding terminal. In such a substrate, the first and third device-attachable regions may form a first pattern, and the second and third device-attachable regions may form a second pattern. The first and second patterns each correspond spatially to the device contact pattern. Optionally, the first pattern is translationally and/or nonrotationally shifted in position relative the second pattern.

Irrespective of the substrate used, the front surface of the device may face the substantially planar surface of the substrate. When the device is attached via device-attachable regions to the substrate, attachment may be accomplished through rigid or flexible means. Rigid means may be used, for example, to produce a package having a flip-chip configuration. Flexible means such as wire bonding or lead bonding may be used to attach the device to the substrate.

Compact microelectronic assemblies may be formed when the substrate surface has an area no greater than about twice of that of the front surface of the microelectronic device. For chip-scale assemblies, the substrate surface area may be no greater than about 1.2 times that of the front surface area of the microelectronic device. In some instances, the substrate may have a surface area about equal to or less than the front surface area of the microelectronic device. When a plurality of microelectronic assemblies is provided as a package, the footprint of the package may be reduced by stacking the microelectronic assemblies.

In a further aspect, the invention relates to a method for attaching a microelectronic device to a substrate. The method employs a microelectronic device and a substrate as described above. By bumping the electrical contacts of the device and attaching the contacts to selected device-attachable regions, a microelectronic package is formed. Optionally, an electrically insulating material is introduced between the device and the substrate. The method is particularly useful in forming packages having a flip-chip configuration.

BRIEF DESCRIPTION OF THE DRAWINGS

FIGS. 1A and 1B depict the substrate connected to the device a first I/O routing arrangement in plan view. FIGS. 1C and 1D the substrate connected to the device in a second I/O routing arrangement. FIGS. 1B and 1D depict in magnified view portions of the I/O routing arrangement shown in FIGS. 1A and 1C, respectively, as enclosed in a boxes formed from dotted lines

DETAILED DESCRIPTION OF THE INVENTION

Figure 1A:
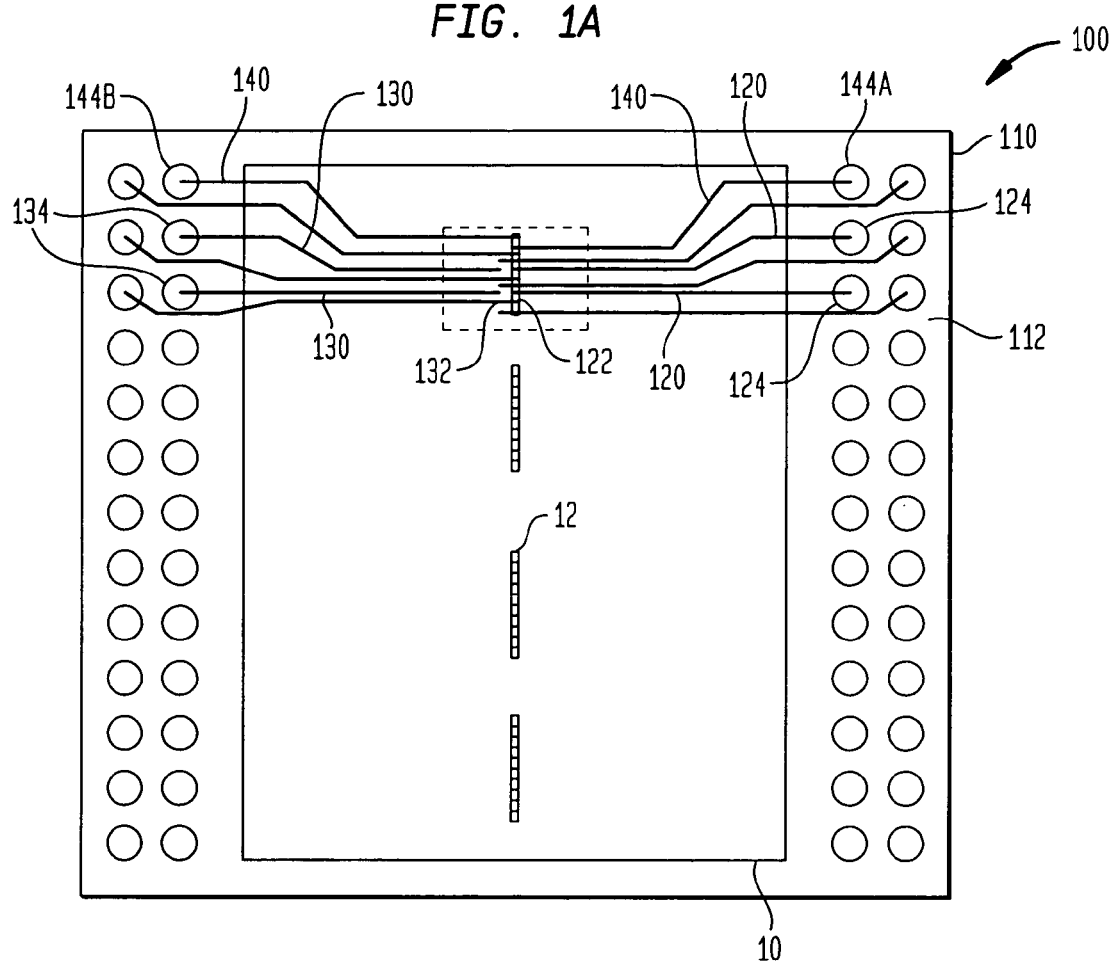
FIGS. 1A–1D, collectively referred to as FIG. 1, depict an exemplary substrate of the invention having a microelectronic device placed in a face-down relationship to substrate.

Before describing the present invention in detail, it is to be understood that the invention is not limited to specific microelectronic devices or types of electronic products, as such may vary. It is also to be understood that the terminology used herein is for the purpose of describing particular embodiments only, and is not intended to be limiting.

As used in this specification and the appended claims, the singular article forms "a," "an," and "the" include both singular and plural referents unless the context clearly dictates otherwise. Thus, for example, reference to "a region" includes a plurality of regions as well as a single region, reference to "a terminal" includes an array of terminals as well as a single terminal, reference to "a microelectronic device" includes a single device as well as a combination of devices, and the like.

In addition, terminology indicative or suggestive of a particular spatial relationship between elements of the invention is to be construed in a relative sense rather an absolute sense unless the context of usage clearly dictates to the contrary. For example, the term "face-down" as used to describe the spatial orientation of the device does not necessarily indicate that the front surface of the device represents the lowest point of the device. In addition, a "substrate" is not necessarily located below another element, e.g., a microelectronic device, of the microelectronic package. Thus, in an assembly that includes a substrate and device in a face-down orientation, the substrate may be located above, at the same level, or below the front device surface depending on the assembly's orientation.

One aspect of the invention relates to a substrate for packaging a microelectronic device, typically in a flip-chip configuration, so as to provide the electrical contacts of the device with versatile I/O routing arrangements. The substrate includes a support member having a substantially planar surface, and first, second, and third electrically conductive paths. The electrically conductive paths each extends from a corresponding device-attachable region on the substantially planar surface.

The device typically includes a pattern of electrical contacts on a front surface thereof. The device-attachable regions are generally arranged such that they correspond spatially to the device contact pattern. This may be achieved, for example, by locating each third device-attachable regions substantially equidistant to the first and second device-attachable regions. In addition or in the alternative, the first and third device-attachable regions may form a first pattern, while the second and third device-attachable regions form a second pattern. In such a case, the device contact pattern may correspond spatially to each of the first and second patterns. Optionally, the first pattern is translationally and/or nonrotationally shifted in position relative the second pattern.

FIG. 1 depicts an exemplary substrate 100 of the invention having two I/O routing arrangements in combination with an associated microelectronic device 10. As with all figures referenced herein, in which like parts are referenced by like numerals, FIG. 1 is not to scale, and certain dimensions may be exaggerated for clarity of presentation. The substrate 100 includes a support member 110 having a substantially planar major rectangular surface 112. The support member of the invention is typically comprised of a base film of a dielectric material. The dielectric material may be selected according to its functionality. In addition, depending on the material used and the handling requirements, the base film may be flexible, semi-flexible or substantially rigid. For example, when high rigidity, hardness, and/or high temperature dimensional stability is required, the dielectric material may be comprised of a ceramic material. Exemplary ceramic materials include single or mixed metal oxides such as aluminum or silicon oxides, nitrides, and carbides.

However, when flexibility is desired, polymeric materials may be used as the dielectric material. Base polymeric films may be substantially inextensible. Polyimide, for example, is a high performance polymer that has a number of desirable properties for advanced electronic applications. Polyimide films have a high degree of thermal stability, permitting them to withstand processing at elevated temperatures. They have low shrinkage, reasonably high strength and modulus. This enhances handling during processing, especially for very thin materials. The dielectric constant for polyimide is as low as 3.2. They also have low dissipation factor and good dielectric strength.

Polyimides are chemically stable, and withstand harsh chemical environments associated with circuit board processing. At the same time, certain polyimides are chemically etchable in hot potassium hydroxide, and all commercially available polyimides are laser ablatable. Polyimides are also available to address specific application requirements. Suppliers of polyimide base film include: E.I. DuPont de Nemours & Co., Ube Industries, Ltd., and Kaneka Corporation.

Other polymeric materials include, but are not limited to, polyesters such as polyethylene terephthalate and polyethylene naphthalate, polyalkanes such as polyethylene, polypropylene and polybutylene, halogenated polymers such as partially and fully fluorinated polyalkanes and partially and fully chlorinated polyalkanes, polycarbonate, epoxies, and polysiloxanes. Substrates formed from such films may be provided as a reel in the form of a continuous roll.

In some instances, the dielectric material may be formed from a combination of polymeric and ceramic materials. For example, fiberglass laminates may serve as the base film. Such laminates may include two to four alternating layers fiberglass and epoxy, wherein successive fiberglass layers may be laid in traversing, e.g., orthogonal, directions. Optionally, heat resistive compounds such as bismaleimide triazine (BT) may be added to such laminate substrates. Other composite materials may be used as well.

Film thickness may vary. In general, the thickness requirements for the base film depends on the strength of the material as well as the stresses imposed on the substrate. Bare polymeric films having a thickness of about 5 µm to about 500 µm, for example, may be used for reel-to reel web processes. In some instances, polymeric films may have a thickness on the order of about 20 µm to about 100 µm. In particular, polyimide films are commercially available 12.5 µm to 125 µm, although 25 µm and 50 µm films are most common In addition, a plurality of electrically conductive paths is provided for forming a plurality of I/O routing arrangements Each path extends from a device-attachable region on the support member surface to a corresponding terminal. Some of the paths may serve to conduct signals for a plurality of I/O routing arrangements while others may serve to conduct signals for a unique I/O routing arrangement. For example, FIG. 1 depicts first, second, and third electrically conductive paths, 120, 130, and 140 respectively, on major surface 112. Each electrically conductive path extends from a device-attachable region to a corresponding terminal. Thus, each first electrically conductive path 120 extends from a first device-attachable region 122 to a first terminal 124, each second electrically conductive paths 130 extends from a second device-attachable region 132 to a second terminal 134, and each third electrically conductive path 140 extends from a third device-attachable region 142 to a third terminal 144.

As shown, the exemplary substrate 100 of FIG. 1 provides first and second I/O routing arrangements. The first paths 120 are unique to the first I/O routing arrangement, and the second paths 130 are unique to the second I/O routing arrangement. In addition, equal numbers of first and second electrically conductive paths are provided. However, the third paths are shared by the first and second I/O routing arrangements.

As discussed above, the substrate is typically used to provide different I/O routing arrangements for a particular microelectronic device. The invention may be used with microelectronic devices of any of a number of forms, including, but not limited to, the form of a chip or a wafer. While the device typically has opposing front and rear surfaces, wherein the front surface provides electrical accessibility, microelectronic devices of any geometry may benefit from the invention. In addition, the invention may be used in conjunction with microelectronic devices used for any of a number of applications, including, for example, semiconductor processors, memory chips, micro-electromechanical systems (MEMS), optical devices, and microfluidic devices. Furthermore, the device may be constructed to contain or exclude specific feature according to the intended use of the device. For example, when the device is not intended for optical applications, the device may contain no optically sensitive and/or emitting element.

Nevertheless, microelectronic devices suitable for use with the inventive substrate typically have a substantially planar front major surface and an optionally opposing surface that is parallel to the front device surface. In addition, the front surface of the microelectronic device may include a plurality of electrical contacts arranged in a pattern such as an array. For example, the rectangular microelectronic device 10 of FIG. 1 has a plurality contacts 12 generally located in a central portion of the front device surface, optionally in a manner such that they are substantially absent from a peripheral portion of the device surface. The contacts 12 are depicted in linear arrays. That is, each linear array contains a plurality of colinear contacts having equidistant neighboring contacts. Each array lies along a line 14 defined by center points of opposing edges of the device that bisects the front device surface.

The device attachable regions of the inventive substrate may correspond spatially to the contacts 12 of the microelectronic device 10. As shown, the device attachable regions may be disposed on or near a dotted line defined by center points of opposing edges of the device that bisects the front surface 112. The third device-attachable regions 142 are depicted as being located substantially equidistant to the first device-attachable regions 122, and the second device-attachable regions 132. Because the third device-attachable regions 142 are depicted as being larger in area than the area of either one or the combination of the first and the second device-attachable regions 122, 132, the third device-attachable regions 142 are colinear to each of the first and second device-attachable regions 122, 132. In turn, the line on which colinear first device-attachable regions 122 are located is parallel to the line on which colinear second device-attachable regions 132 are located.

As a result, the first and third device-attachable regions form a first device-attachable pattern, and the second and third device-attachable regions form a second device-attachable pattern. The device contact pattern may correspond spatially to each of the first and second patterns each correspond spatially to the device contact pattern. As shown, both the device contact pattern and each of the first and second device-attachable patterns are comprised of a plurality of colinear linear arrays. As discussed above, the linear arrays of the first pattern lie and a line that is parallel to the line on which the linear arrays of the second pattern.

In general, the conductive paths 120, 130, and 140 may be located entirely on the support member surface 112. In such a case, the paths 120, 130, and 140 are separated by surface regions of front surface 112. In addition, the paths may take any of a number of forms, e.g., linear, bowed, serpentine, spiral, or any tortuous route. For example, as shown, the portions of conductive paths 120, 130, 140 near device-attachable regions 122, 132, 142 are linear and substantially parallel to each other. In particular, the portions of the first and second electrically conductive paths 120, 130 near the first and second device-attachable regions 122, 130 are depicted as being colinear. However, some or all of the conductive paths may be partially or entirely nonlinear and/or nonparallel to each other as well.

Furthermore, the terminals may also be located on the support member surface or elsewhere. To provide systematic addressability, however, the terminals may be arranged on the same surface in an ordered arrangement, e.g., an array such as colinear arrangements of equidistant neighboring features, rectilinear grids, parallel stripes, spirals, and the like. For example, as shown in FIG. 1, all terminals 124, 134, 144, are all located on major surface 112. The first terminals 124 and some of the third terminals 144A are arranged in a first rectilinear array comprised of parallel columns of colinear terminals. Similarly, the second terminals 134 and the rest of the third terminals 144B are arranged in a second rectilinear array. As shown, the first and second arrays exhibit mirror symmetry across member surface 112 along a surface-bisecting line defined by center points of opposing lengthwise edges of the support member surface 112.

In general, the device-attachable regions, the electrically conductive paths, and the terminals must be formed from an electrically conductive material. The device-attachable regions, the electrically conductive paths, and/or the terminals may be formed form the same or different materials. In any case, the conductive material may be made from one or more metals. For example, a conductive path may be comprised of solid copper or a composite composition containing copper particles. Typically, small-grained metals are preferred for greater feature resolution.

Additional metals suitable for use in the invention include, for example, gold, silver, nickel, tin, chromium, iron, aluminum, zinc, titanium, platinum, combinations thereof, and alloys of any of the foregoing such as brass, bronze, and steel. In some instances, a surface layer may be provided over a base conductive layer, wherein the surface and base layers have differing compositions. For example, a highly conductive coating such as gold, gold/nickel, gold/osmium or gold/palladium, may be coated on a less conductive material. In addition or in the alternative, a base layer may be plated with a wear resistant coating such as osmium, chromium or titanium nitride.

In addition or in the alternative, a nonmetallic conductive material may be used. Exemplary nonmetallic conductive materials include carbon, e.g., graphite or acetylene black, conductive ceramics such as indium tin oxide and titanium nitride, and conductive polymers such as polypyrrole and polyaniline.

Additive and/or subtractive processes may be used to form the electrically the device-attachable regions, the electrically conductive paths, and/or the terminals. In additive processes, a dielectric surface, e.g., the support member surface, may be provided, followed by the selective patternwise deposition of electrically conductive regions on the surface. Optionally, lithographic techniques may be used to effect patternwise deposition. For example, photolithographic masking techniques may be to effect patternwise vapor deposition of a metallic layer on the surface of the dielectric layer.

For subtractive processes, precursor sheets may be used comprising a contiguous electrically conductive layer overlying a dielectric layer, e.g., copper on polyimide. For example, at least one sheet may be formed by providing precursor sheet and selectively removing material from the electrically conductive layer. As a result, portions of the dielectric layer are exposed, to form the device-attachable regions, the electrically conductive paths, and/or the terminals separated by the exposed portions of the dielectric layer.

In short, the invention may take advantage of commercially available metal-clad tapes, e.g., copper on polyimide. Either or both single-metal clad and double metal-clad tapes may be used. Single-metal clad tapes will tend to be significantly less expensive than double-metal clad tapes. In addition, cost savings may be realized by avoiding conductive via formation extending through the support member. However, greater functionality may be provided when a double-metal-clad tape is used in the context of the invention.

Thus, the substrate 100 of FIG. 1 allows the microelectronic device contacts 12 to be provided electrical communication to the device-attachable regions of the first and/or the second patterns so as to allow the device to have two different I/O routing arrangements. For example, the front surface of the device 10 may be placed so that it faces the substantially planar surface 112 of the support member 110. Such a face-down orientation allows the device to be attached to the substrate in a flip-chip configuration. In the alternative, the device may be wire bonded or lead bonded to the substrate.

Figure 1B:
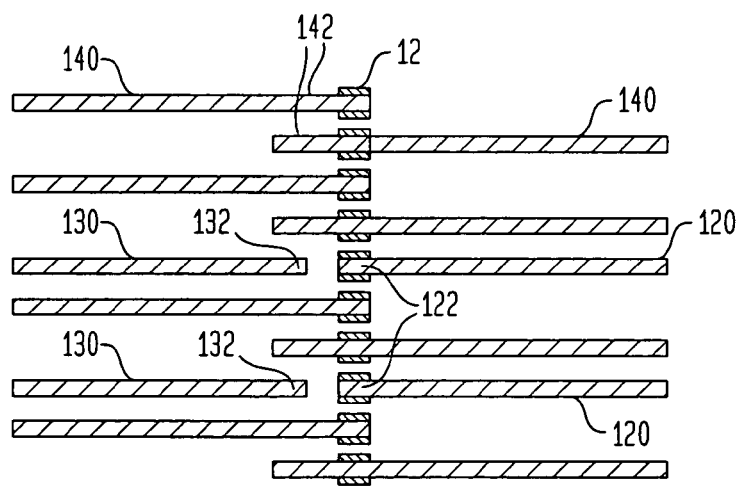
Figure 1C:
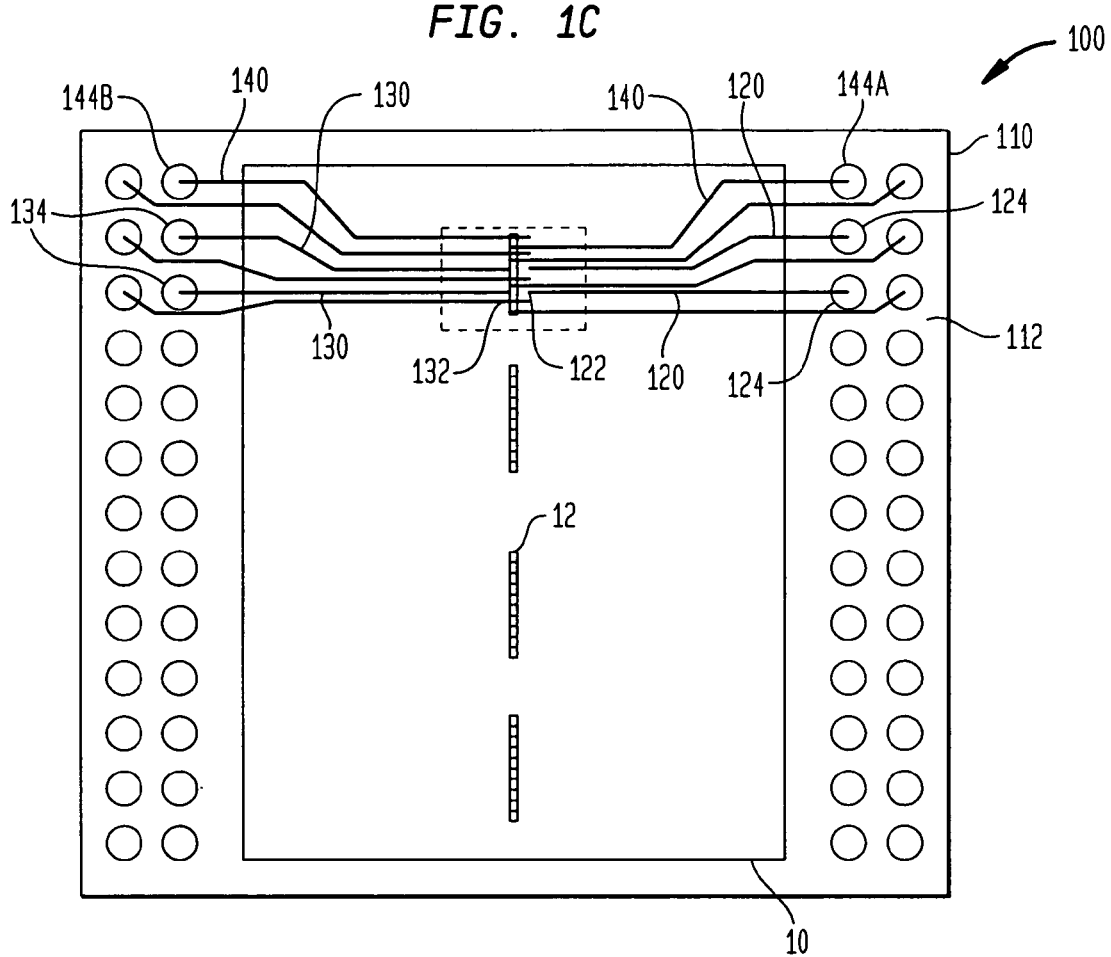
Figure 1D:
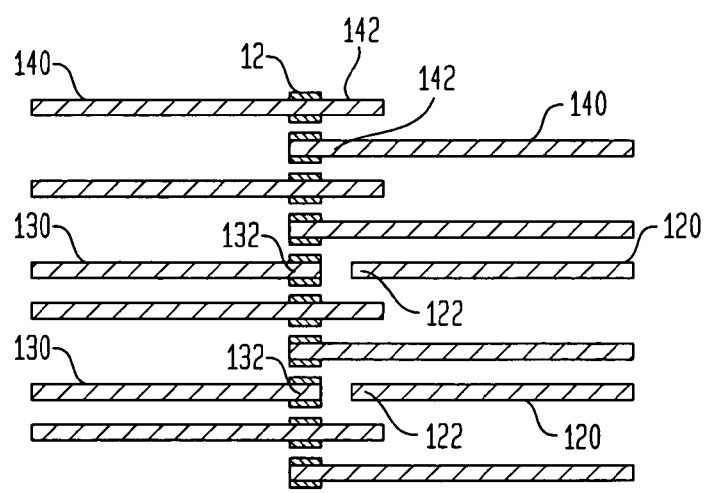

As shown in FIGS. 1A and 1B, the device contacts 12 are shown in contact with the first and third device-attachable regions 122, 142. As a result, the substrate 100 provides access to the device contacts 12 through terminals 124 and 144A. That is, the device contacts are routed through an I/O configuration that includes terminals 124 and 144, paths 120 and 140, and conductive regions 122 and 142. In the alternative, as shown in FIGS. 1C and 1D, the device contacts 12 may be placed in contact with the second and third device-attachable regions 132, 142. That is, the device and substrate are slightly shifted relative to one another. As a result, the substrate 100 provides access to the device contacts 12 through terminals 134 and 144A. That is, the device contacts are routed through an I/O configuration that includes terminals 134 and 144, paths 130 and 140, and conductive regions 132 and 142.

For high pitch applications, the corresponding first and second device-attachable regions may be no more than about 1 mm, preferably no more than about 0.1 mm, from each other. Accordingly, when the first and second device-attachable regions are a short distance apart, the invention allows assemblies having different I/O routing for any particular device simply by shifting its attachment to the substrate.

Figure 2:
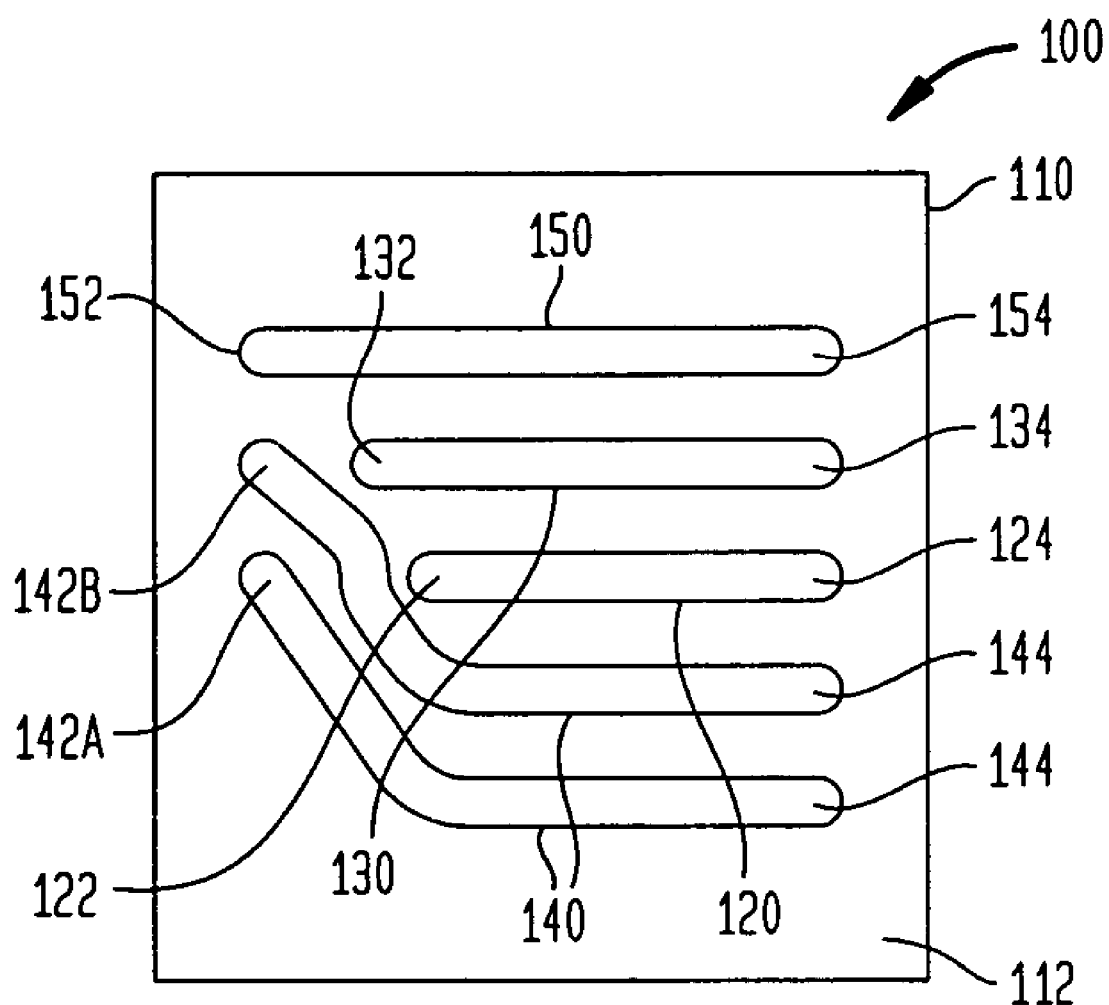
FIG. 2 depicts in top view another exemplary substrate of the invention, having first, second, and third, and four I/O routing arrangements.

While the substrate depicted in FIG. 1 has two different I/O routing arrangements, the invention also provides substrates having more than two I/O routing arrangements. For example, FIG. 2 depicts a substrate 100 having three different I/O routing arrangements. Like the substrate depicted in FIG, 1, the substrate 100 of FIG. 2 also includes a support member 110 having a substantially planar major rectangular surface 112. In addition, a plurality of electrically conductive paths is provided for forming a plurality of I/O routing arrangements For example, FIG. 2 depicts first, second, third, and fourth electrically conductive paths, 120, 130, 140, 150 respectively, on major surface 112. Each electrically conductive path extends from a device-attachable region to a corresponding terminal. Thus, the first electrically conductive path 120 extends from a first device-attachable region 122 to a first terminal 124, the second electrically conductive path 130 extends from a second device-attachable region 132 to a second terminal 134, each third electrically conductive path 140 extends from a third device-attachable region 142 to a third terminal 144, and the fourth electrically conductive path 150 extends from a fourth device-attachable region 152 to a fourth terminal 154.

As shown, the exemplary substrate 100 of FIG. 2 provides first, second and third I/O routing arrangements. The first path 120 is unique to the first I/O routing arrangement, the second path 130 is unique to the second I/O routing arrangement, and the fourth path 150 is unique to the third I/O routing arrangement. In addition, equal numbers of first, second, and fourth electrically conductive paths are provided. However, the third paths are shared by the first, second, and third I/O routing arrangements.

In addition, FIG. 2 depicts third device-attachable regions 144 of different shapes. Device-attachable region 144A is represents a terminus of its corresponding conductive path 140A. However, device-attachable 144B is provided in the shape of a quarter-circular arc, wherein each point in the arc is equidistant to device attachable-region 144A. In any case, the third device-attachable regions 144 are depicted as being located substantially equidistant to each of the first, second, and fourth device-attachable regions 124, 134, 154. That is, each of the first, second, and fourth device-attachable regions 124, 134, 154 lie on an quarter-circular arc and are each colinear with device attachable regions 144.

As a result, the first and a portion of the third device-attachable regions form a first device-attachable linear array, and the second and a portion of the third device-attachable regions form a second device-attachable linear array, and the fourth and a portion of the third device-attachable regions for a third device attachable linear array. The first, second, and third linear device attachable arrays are substantially identical to but rotated from each other. Thus, the device-attachable linear array may correspond spatially the same device contact pattern.

Figure 3A:
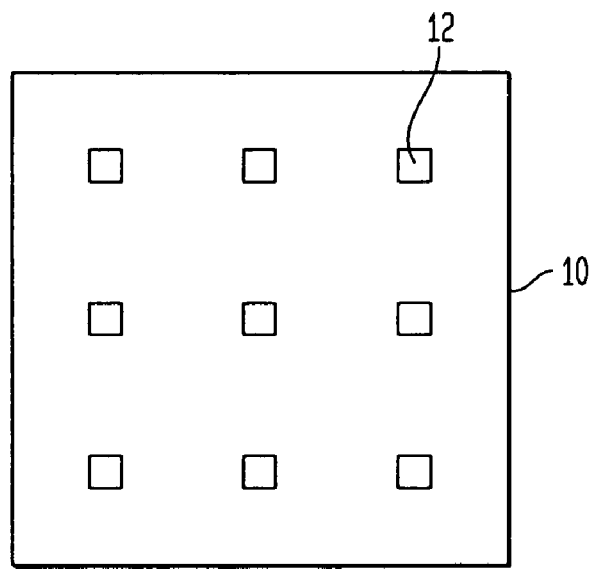
FIGS. 3A and 3B, collectively referred to as FIG. 3, depict an exemplary substrate of the invention and a corresponding microelectronic device.
Figure 3B:
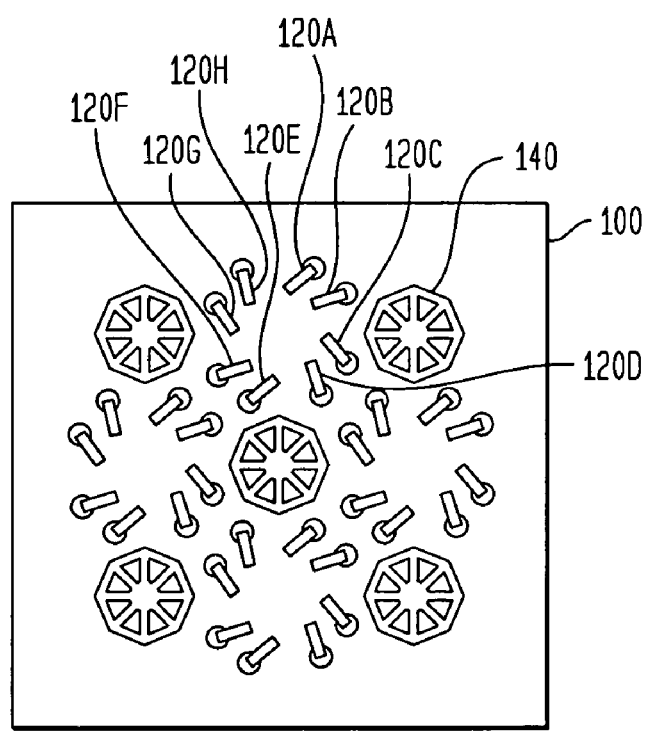

FIG. 3 depicts a substrate 100 having eight different I/O routing arrangements for a device 10 that has a plurality of contacts 12 located in a rectilinear array on the front device surface. The substrate 100 includes a support member 110 having a substantially planar major square surface 112. In addition, first through ninth electrically conductive paths 120A–120H and 140 on major surface 112 are provided for forming a plurality of I/O routing arrangements. Each electrically conductive path extends from a device-attachable region to a corresponding terminal. Paths 140 are shared by all I/O routing arrangements, while paths 120A–120H are unique to the different I/O routing arrangements.

As discussed above, the invention is particularly suited for flip-chip packaging applications. Thus, the invention substrate and variants thereof may be employed in a method for attaching a microelectronic device to a substrate in an optional flip-chip configuration. The method typically involves providing a microelectronic device and substrate as described. In addition, the electrical contacts on the front device surface. Once bumped, the electrical contacts are bonded to either the first or second pattern of device-attachable regions. In the alternative, either the first or second pattern of device-attachable regions are bumped and bonded to the electrical contacts.

Optionally, a solder mask is included. In general, when solder is used to provide connections between the packaged device and an external circuit such as a printed circuit board (PCB), it is desirable to prevent uncontrolled wicking, wetting and other forms of uncontrolled solder flow. A solder mask, typically an organic material, may be used to mask areas adjacent to the regions on which the solder may contact. In particular, a solder resist may serve to prevent lateral flow of the solder along the conductive path. Thus, the solder mask may be used to contain the bumping and any subsequent reflow. The solder mask is typically located a portion of the substantially planar support member surface other than the device attachable regions.

When a flip-chip configuration is desired, rigid attachment may be established between the electrical contacts and the first or second pattern of device-attachable regions. Further optionally, an electrically insulating material may be introduced between the microelectronic device and the substrate. The insulating material may confer extended operation life to the assembly. The electrically insulating material is typically polymeric. In some instances, the polymeric coating may be formed through in situ polymerization or crosslinking. For example, a fluid containing monomers may be dispensed onto a member surface for polymerization. The polymerization may be effected, e.g., through thermal, chemical, or photolytic curing. However, already formed polymers may be used as well. For example, thermoplastic polymers, i.e., polymers having a relatively large window of thermostability, may be deposited using processes that involve involving extrusion and/or injection. In addition, solvents may be used to dissolve polymers for dispensing. Once dispensed, the solvent may be evaporated through the application of heat and/or vacuum.

In any case, compact microelectronic assemblies may be formed using the invention. Typically, the substrate surface has an area no greater than about twice of that of the front surface of the microelectronic device. For chip-scale assemblies, the substrate surface area may be no greater than about 1.2 times that of the front surface area of the microelectronic device. In some instances, the substrate may have a surface area about equal to or less than the front surface area of the microelectronic device. When a plurality of microelectronic assemblies is provided as a package, the footprint of the package may be reduced by stacking the microelectronic assemblies. However, each substrate may at least one dimension that exceeds that of the microelectronic device to facilitate electrical communication between the different levels.

In its preferred forms, the invention provides a number of advantages over substrates and methods for forming substrates known in the art. For example, the preferred forms of the invention can provide stack packages unique I/O routing without having to resort to different substrate designs for different layers. In addition, for circuit-in design for packages such as flip-chip, the invention may allow for the use of substrates that do not contain any vias. This is advantageous because vias tend to cause design (e.g., space constraints) and process (e.g., die attach leak, contamination, etc.) problems.

Variations of the present invention will be apparent to those of ordinary skill in the art. For example, while the substrates depicted in FIGS. 1–3 have a generally rectangular surface, other shapes may be used as well. In addition, alignment means known in the art, e.g., mating features, optical guides, devices used in metrology, etc., may be used to facilitate proper positioning of the device relative to the substrate. Other variations of the invention may be discovered upon routine experimentation without departing from the spirit of the present invention.

Although the invention herein has been described with reference to particular embodiments, it is to be understood that these embodiments are merely illustrative of the principles and applications of the present invention. It is, therefore, to be understood that numerous modifications may be made to the illustrative embodiments and that other arrangements may be devised without departing from the spirit and scope of the present invention as defined by the appended claims.

All patents, patent applications and publications mentioned herein are hereby incorporated by reference in their entireties.

The invention claimed is:

1. A substrate for packaging a microelectronic device, comprising:
    a support member having a substantially planar surface;
    a first electrically conductive path extending from a first device-attachable region on the substantially planar surface to a first terminal;
    a second electrically conductive path extending from a second device-attachable region on the substantially planar surface to a second terminal; and
    a plurality of third electrically conductive paths, each path extending from a third device-attachable region on the substantially planar surface to a third terminal,
    wherein each of the third device-attachable regions are substantially equidistant to the first and second device-attachable regions.

2. The substrate of claim 1, comprising an equal number of first and second electrically conductive paths.

3. The substrate of claim 2, comprising a plurality of corresponding first and second device-attachable regions.

4. The substrate of claim 1, wherein each first, second, and third electrically conductive path is located entirely on the substantially planar surface.

5. The substrate of claim 1, wherein the device-attachable regions of the electrically conductive paths are no more than about 1 mm from each other.

6. The substrate of claim 5, wherein the device-attachable regions of the electrically conductive paths are no more than about 0.1 mm from each other.

7. The substrate of claim 3, wherein the corresponding first and second device-attachable regions are no more than about 1 mm from each other.

8. The substrate of claim 7, wherein the corresponding first and second device-attachable regions are no more than about 0.1 mm from each other.

9. The substrate of claim 1, wherein the first and third device-attachable regions are colinear.

10. The substrate of claim 1, wherein at least portions of the first and second electrically conductive paths are colinear.

11. The substrate of claim 1, wherein at least portions of the first and third electrically conductive paths are parallel.

12. The substrate of claim 1, wherein the first terminal and at least some third terminals are arranged in a first array.

13. The substrate of claim 12, wherein the second terminal and at least some third terminals are arranged in a second array.

14. The substrate of claim 13, wherein the first and second arrays exhibit mirror symmetry.

15. The substrate of claim 1, wherein at least some of the electrically conductive paths, at least some of the device-attachable regions, and/or at least some terminals comprise a metal.

16. The substrate of claim 15, wherein the metal is selected from gold, copper, silver, nickel, tin, chromium, iron, alloys thereof, or combinations of any of the foregoing.

17. The substrate of claim 1, having no conductive via extending through the support member.

18. The substrate of claim 1, further comprising a solder mask on a portion of the substantially planar surface.

19. The substrate of claim 1, wherein the support member is flexible.

20. A reel, comprising a plurality of substrates of claim 19 as a continuous roll.

21. A microelectronic assembly, comprising:
    a microelectronic device having a front surface and a plurality of electrical contacts arranged in a device contact pattern thereon; and
    a substrate comprising
        a support member having a substantially planar surface, and
        first, second, and third electrically device-attachable regions on the substantially planar surface, each region extending along a conductive path to corresponding terminal,
    wherein the first and third electrically device-attachable regions form a first pattern, the second and third electrically device-attachable regions form a second pattern, and the first and second patterns each correspond spatially to the device contact pattern; wherein the front surface of the microelectronic device faces the substantially planar surface of the substrate and the microelectronic device is attached via device-attachable regions to the substrate.

22. The microelectronic assembly of claim 21, wherein the microelectronic device is rigidly attached to the substrate in a flip-chip configuration.

23. The microelectronic assembly of claim 21, wherein the microelectronic device is attached via device-attachable regions to the substrate.

24. The microelectronic assembly of claim 23, wherein the microelectronic device is wire bonded or lead bonded to the substrate.

25. The microelectronic assembly of claim 21, wherein the device contact pattern comprises an array of electrical contacts.

26. The microelectronic assembly of claim 25, wherein the electrical contacts of the array are colinear.

27. The microelectronic assembly of claim 21, wherein the first pattern is translationally shifted in position relative the second pattern on the substantially planar surface of the substrate.

28. The microelectronic assembly of claim 21, wherein the first pattern is nonrotationally shifted in position relative to the second pattern on the substantially planar surface of the substrate.

29. The microelectronic assembly of claim 21, wherein the substantially planar surface of the substrate has an area no greater than about twice of that of the front surface of the microelectronic device.

30. The microelectronic assembly of claim 29, wherein the substantially planar surface of the substrate has an area no greater than about 1.2 times that of the front surface of the microelectronic device.

31. The microelectronic assembly of claim 30, wherein the substantially planar surface of the substrate has an area no greater than that of the front surface of the microelectronic device.

32. A microelectronic package comprising a plurality of microelectronic assemblies of claim 21.

33. The microelectronic package of claim 32, wherein the microelectronic assemblies are stacked.

* * * * *

UNITED STATES PATENT AND TRADEMARK OFFICE
CERTIFICATE OF CORRECTION

PATENT NO. : 7,208,820 B2
APPLICATION NO. : 11/025440
DATED : April 24, 2007
INVENTOR(S) : Ilyas Mohammed It is certified that error appears in the above-identified patent and that said Letters Patent is hereby corrected as shown below:

On the title page of Patent No. 7,208,820, under (57) Abstract, line 6, "each extends from" should read -- each extend from --.
On the title page of Patent No. 7,208,820, under (57) Abstract, line 12, "regions may form" should read -- regions forming --.
Column 1, line 23, "packages CSPs" should read -- packages of CSPs --.
Column 2, line 15, "bismaleimide" should read -- Bismaleimide --.
Column 2, line 28, "join, and etc." should read -- join, etc. --.
Column 2, line 29, "substrates increases" should read -- substrates increase --.
Column 2, line 45, "conductive paths" should read -- conductive path --.
Column 3, line 50, "twice of that" should read -- twice that --.
Column 4, line 5, "to substrate" should read -- to the substrate --.
Column 4, line 7, "device a first" should read -- device in a first --.
Column 4, line 8, "1C and 1D the" should read -- 1C and 1D depict the --.
Column 4, line 11, "in a boxes" should read -- in boxes --.
Column 4, line 40, "sense rather an" should read -- sense rather than an --.
Column 4, line 59 "extends from" should read -- extend from --.
Column 4, line 66, "regions substantially" should read -- region substantially --.
Column 5, line 59, "alternating layers" should read -- alternating layers of --.
Column 6, line 9, "routing arrangements" should read -- routing arrangements. --.
Column 6, line 21, "conductive paths" should read -- conductive path --.
Column 6, line 48, "specific feature" should read -- specific features --.
Column 6, line 59, "plurality contacts" should read -- plurality of contacts --.
Column 7, line 23, "correspond spatially" should read -- corresponding spatially --.
Column 7, line 27, "pattern lie and" should read -- pattern lie in --.
Column 7, line 28, "second pattern" should read -- second pattern lie --.
Column 8, line 22, "electrically the device-" should read -- electrically device- --.
Column 8, line 29, "may be to" should read -- may be used to --.
Column 8, line 52, "to be provided" should read -- to provide --.
Column 9, line 50, "region 144A is" should read -- region 144A --.
Column 9, line 59, "on an quarter-circular" should read -- on a quarter-circular --.
Column 10, line 2, "spatially the" should read -- spatially to the --.
Column 10, line 5, "plurality" should read -- plurality of --.
Column 10, line 22, "contacts on" should read -- contacts are on --.

UNITED STATES PATENT AND TRADEMARK OFFICE
CERTIFICATE OF CORRECTION

| | |
|---|---|
| PATENT NO. | : 7,208,820 B2 |
| APPLICATION NO. | : 11/025440 |
| DATED | : April 24, 2007 |
| INVENTOR(S) | : Ilyas Mohammed |

It is certified that error appears in the above-identified patent and that said Letters Patent is hereby corrected as shown below:

Column 10, line 39, "typically located a" should read -- typically located on a --.
Column 10, line 57, "that involve involving" should read -- that involve --.
Column 10, line 63, "twice of that" should read -- twice that --.
Column 11, line 5, "may at least" should read -- may be at least --.
Column 11, line 55, "regions are" should read -- regions is --.
Column 12, line 48, "conductive path to" should read -- conductive path to a --.
Column 13, line 7, "relative" should read -- relative to --.
Column 13, line 16, "twice of that" should read -- twice that --.

Signed and Sealed this

Thirteenth Day of May, 2008

JON W. DUDAS
*Director of the United States Patent and Trademark Office*